United States Patent [19]

Horst et al.

[11] 3,873,313

[45] Mar. 25, 1975

[54] PROCESS FOR FORMING A RESIST MASK

[75] Inventors: Richard S. Horst, Wappingers Falls; Leon H. Kaplan, Yorktown Heights; David P. Merritt, Cold Spring, all of N.Y.

[73] Assignee: International Business Machines Corporation, Armonk, N.Y.

[22] Filed: May 21, 1973

[21] Appl. No.: 362,637

[52] U.S. Cl. .......... 96/36, 96/36.2

[51] Int. Cl. .......... G03c 5/00

[58] Field of Search .......... 96/36, 36.2, 36.3

[56] References Cited

UNITED STATES PATENTS

| | | | |
|---|---|---|---|
| 2,937,085 | 5/1960 | Seven et al. | 96/75 |
| 3,085,008 | 4/1963 | Case | 96/75 |
| 3,317,320 | 5/1967 | Reber | 96/36.2 |
| 3,518,084 | 6/1970 | Barson et al. | 96/36 |
| 3,716,390 | 2/1973 | Garbarini | 96/36 |

*Primary Examiner*—J. Travis Brown

*Attorney, Agent, or Firm*—David M. Bunnell

[57] ABSTRACT

A resist mask formation process in which a first layer of photoresist is applied to a substrate, blanket exposed to react the photoactive material in the resist and postbaked. A second layer of photoresist is then applied, exposed patternwise, and portions of the substrate are uncovered by solvent development of the resist layers.

9 Claims, No Drawings

PROCESS FOR FORMING A RESIST MASK

BACKGROUND OF THE INVENTION

This invention relates generally to photolithography and more particularly to a double layer resist mask formation process.

The use of photolithography for the formation of relief patterns having very fine geometry is well known. Examples of specific applications include the formation of integrated circuits and the formation of magnetic recording heads.

In the conventional pattern forming process, a substrate to be processed is coated with a layer of a radiation sensitive composition, or photoresist. The layer is then exposed patternwise to electromagnetic radiation such as, for example, light, X-ray, gamma ray, ion beam and electrons to change the solubility characteristics of portions of the layer. A relief image is formed by the solvent removal of the more soluble portions of the radiation sensitive layer. The portions removed will be either the exposed or the unexposed resist depending upon whether a positive or negative resist is employed. The remaining portions of the resist layer act as a mask to protect parts of the substrate while the remainder of the substrate is treated such as by etching, coating, diffusion, or other processing techinques.

One problem which occurs in photolithographic processing is resist lift off during the processing so that portions of the substrate which should be protected are adversely affected by the processing. For example, an undue enlargement of the pattern or undercutting during etching. This problem becomes more acute as the pattern dimensions become very fine. Solutions to the adhesion problem for many applications have included postbaking the developed resist layer, the use of a special adhesion promoting layer prior to forming the resist layer such as is described, for example, in U.S. Pat. No. 3,549,368 or the addition of adhesion promoting additives to the resist coating solution itself.

We have now found a new process for promoting adhesion. The process requires no postbake of the patterned resist layer so that pattern distortion due to resist flow is eliminated. There is no solvent development of a pattern prior to the baking of the layer which is in contact with the substrate surface so that resist lift off during development is avoided. The new process is also less sensitive to the surface condition of the substrate than prior processes, and allows easier stripping of the resist after the desired processing is completed.

BRIEF DESCRIPTION OF THE INVENTION

In accordance with this invention a process is provided for forming a resist mask on a substrate comprising the steps of forming a first layer of photoresist on a substrate, blanket exposing the photoresist, baking the first photoresist layer, forming a second layer of photoresist on the first layer, patternwise exposing the second photoresist layer, and developing a relief image through the photoresist layers to expose parts of the substrate.

DETAILED DESCRIPTION

The foregoing and other objects, features and advantages of the invention will be apparent from the following preferred embodiments of the invention wherein parts are parts by weight unless otherwise indicated.

Photoresist compositions useful in the practice of the subject invention are well known in the art. Negative photoresists are those which cross link and become less soluble upon exposure to radiation. Examples of negative resists are sensitized polyvinyl cinnamate polymer compositions such as are described in U.S. Pat. No. 2,732,301 and sensitized partially cyclized poly-cis-isoprene polymer compositions such as are described in U.S. Pat. No. 2,852,379. Examples of positive photoresists which become more soluble upon exposure to radiation are the sensitized novolak resins such as are described, for example, in U.S. Pat. Nos. 3,201,239 and 3,666,473. The resists are applied to substrates from solvent mixtures using conventional techniques such as spraying, flowing, roller coating, spinning and dip coating after which the solvent is removed by evaporation, which is sometimes aided by low temperature baking, to leave a layer of resist on the surface of the substrate.

In the process of the invention, a first layer of photoresist is coated onto the substrate to be processed in a conventional manner. The entire resist layer is then flooded with a sufficient dose of radiation so that the photosensitive material is substantially all reacted, i.e., blanket exposed. The photoresist layer is then baked at a relatively high temperature to provide improved adhesion of the layer to the substrate surface. The baking temperatures conventionally employed to obtain improved adhesion are usually at least about 140°C. The optimum exposure times and baking times and temperatures for each photoresist can be easily determined by one skilled in the art.

A second layer of photoresist which can be the same or a different photoresist than the first layer is then applied and exposed patternwise in a conventional manner. The layers are then developed to remove the soluble portion of the second layer and the underlying portion of the first layer. The uncovered portions of the substrate are then processed without the need for further baking of the resist layers. This avoids any pattern distortion due to the resist flow of the patterned resist layer. Because the sensitive material in the under layer has been completely reacted by the blanket exposure, the resist is not subject to heat induced cross linking during the baking process. The baking of the first layer, therefore, while improving adhesion does not harden the resist to the extent that it cannot be easily removed by a suitable solvent at room temperature. This is in contrast to conventionally exposed and postbaked resist layers which contain residual photosensitive materials which act to promote cross linking during baking and make the resist layer difficult to remove following the processing of the substrate.

Combinations of positive and negative resist layers can be employed in the process of the invention. If a negative photoresist is used in the first layer, care must be taken to blanket expose in a way that cross linking does not occur such as by using an $O_2$ purge. In the preferred embodiments, a positive resist first layer and a positive or negative resist second layer are employed.

EXAMPLE I

A freshly oxidized silicon wafer having a 7,200A thick silicon dioxide layer, was coated with a positive resist which comprised a m-cresol formaldehyde novolak resin and a diazo ketone sensitizer, 2-diazo-1-oxo-naphthalene-5-sulfonic acid ester of 2,3,4-trihydroxybenzophenone, by spin coating at 3,500 rpm using a dilution of 3 parts by volume of resist to one part by volume of thinner. The thinner was a mixture of about 80 parts by volume cellusolve acetate and 10 parts by volume each of n-butyl acetate and xylene. The wafer was baked for 15 minutes at 90°C and then blanket exposed to actinic radiation for 60 seconds using a conventional exposure station. This exposure was sufficient to react substantially all of the ketone sensitizer. The wafer was then baked for 30 minutes at 170°C. The wafer was recoated by spinning at 10,000 rpm, after applying the same 3:1 dilution of the positive resist used to form the first layer. The resist coated wafer was then prebaked for 15 minutes at 90°C to remove the residual solvent and exposed using a fine geometry mask for 30 seconds. The wafer was immersed in a conventional aqueous alkaline developer which was an approximately 5% by weight mixture including sodium metasilicate and sodium orthophosphate having a pH of about 13.0 for 30 seconds, rinsed in deionized water and blown dry. The substrate was etched in a 7:1 buffered HF solution which was a mixture of 7 parts by volume of 40% ammonium fluoride solution and 1 part by volume of hydrofluoric acid. The lines of the resist pattern were then measured and the resist was stripped by dipping in acetone at room temperature for 30 seconds. The width of the etched lines in the oxide were measured at the top of the oxide and at the silicon surface. The "undercut per side" was then calculated by taking one-half the difference of these measurements. The oxide thickness was measured and the cotangent of the oxide edge angle was calculated by dividing the undercut per side by the oxide thickness. The cotangent determined in this manner is a measure of the adhesion of the resist to the oxide. The case of no undercutting is represented by a value of zero with higher values indicating decreasing adhesion. The cotangent value determined after measuring several sites on the wafer showed an average value of 0.35.

For comparison purposes, a second freshly oxidized silicon wafer with an oxide thickness of about 7,200A was treated by the conventional single layer process by coating the wafer with the positive resist diluted 3:1 at 3,500 rpm, baking for 15 minutes at 90°C to remove the solvent and exposing for 5 seconds using the same mask pattern as before. The wafer was developed in the aqueous alkaline developer for 30 seconds, baked for 30 minutes at 140°C, etched with 7:1 buffered HF and stripped of resist in a conventional stripper which was a mixture of tetrachloroethylene, dichlorobenzene, phenol and a sodium alkyl napthalene sulfonate surfactant for 15 minutes at 95°C. The widths of the etched oxide lines were measured and an average cotangent value determined to be 0.97.

EXAMPLE 2

An oxidized silicon wafer, which had been exposed to ambient conditions for several months such that its surface could therefore be presumed to be highly contaminated was coated with the same resist formulation used in Example 1 according to the conventional single layer process described in the second part of Example 1. The resist layer was exposed imagewise to actinic radiation for 5 seconds and developed in the alkaline developer for 30 seconds. The resultant resist pattern showed catastrophic stripping of the resist during the development step with all lines narrower than about 20 microns being stripped off. This behavior is characteristic of extremely poor resist adhesion.

The wafer was then cleaned by dissolving the remaining resist in acetone. The process of resist application, exposure, and development was then repeated. The results were similar, in that all the lines smaller than 20 microns lifted off during the development. This demonstrated that the acetone cleaning step did not improve the adhesion.

The wafer was again cleaned in acetone and the resist pattern was formed on the wafer by the double layer process of the invention described in the first part of Example 1. The development resulted in a perfect pattern with lines ranging in size down to the mask limit of 1 micron. The wafer was etched and stripped in accordance with the procedure described in the first part of Example 1 and the resulting etched oxide pattern was found to have an average oxide edge cotangent of 0.48.

EXAMPLE 3

Two oxidized silicon wafers with 8,000A thickness of thermal silicon dioxide were immersed for 30 seconds in an etchant which was a 30/10/15 parts by volume mixture of $H_2O/HNO_3/HF$. This treatment has been recognized to create a very poor substrate surface for the adhesion of resist. One of the wafers was coated with a 2:1 dilution of the positive resist to thinner described in Example 1 at 3,600 rpm, prebaked 15 minutes at about 85°C to remove the solvent, blanket exposed for 60 seconds and then postbaked for 30 minutes at a temperature of about 170°C. A second layer of resist was then applied by repeating the above coating and prebaking processes after which the resist layer was exposed imagewise with a mask for 12 seconds. The resist layer was developed for 30 seconds in the aqueous alkaline developer solution, etched in 7:1 buffered HF and stripped in acetone according to the procedure described in Example 1. The oxide etch cotangent was determined to be 1.09.

The remaining wafer was coated with a 2:1 positive resist to thinner solution at 3,600 rpm, prebaked for 15 minutes at 85°C, and exposed imagewise to actinic radiation for 12 seconds. The resist layer was developed for 90 seconds in the aqueous alkaline developer and then postbaked for 60 minutes at 150°C. The wafer was subjected to the buffered etch and the resist stripped according to the procedure described in the second part of Example 1. The cotangent was determined to be 1.53.

EXAMPLE 4

An oxidized silicon wafer was coated with resist, prebaked, blanket exposed, and postbaked according to the procedure described in the first portion of Example 1, to form a solublized positive resist underlayer. A negative resist which was the tradenamed MX752 resist marketed by Eastman Kodak was then applied over the first resist layer by spinning a 1:1 resist to thinner dilution at 6,500 rpm. The resist was prebaked for 15 minutes at 60°C to remove the solvent and then exposed for 7 seconds to actinic radiation using a mask. The resist layer was then spray developed for 5 seconds with the Eastman Kodak tradenamed KOR developer followed by a 5 second spray with n-butyl acetate. After drying, the wafer was immersed in the aqueous alkaline developer for 30 seconds, rinsed in deionized water and blown dry. The oxide was then etched in 7:1 buffered HF and stripped in acetone. The oxide etch cotangent was determined to be 0.61.

EXAMPLE 5

Three freshly oxidized silicon wafers were processed in accordance with the procedures of Example 1, one utilizing the solublized resist under layer and two using the standard single layer process. Of the latter two, the first was baked for 30 minutes at 140°C following development and the second for 30 minutes at 170°C. After etching in buffered HF, the three wafers were immersed in acetone for 2 minutes in an attempt to remove the resist. The wafer processed according to the process of the invention using the solublized under layer could be stripped of resist within 30 seconds. The control wafers did not strip completely clean even after 2 minutes. The control baked at 140°C had a persistent residue, while the wafer baked at 170°C retained the complete resist pattern. The ease of stripping of the resist pattern following the processing of the substrate by using the process of the invention even though a high temperature bake for adhesion purposes was employed is thus demonstrated.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for forming a resist mask on a substrate comprising the steps of:

forming a first layer of positive acting photoresist on a substrate, which photoresist becomes more soluble upon exposure to actinic radiation, blanket exposing the first photoresist layer with actinic radiation so as to react substantially all of the photosensitive material in said photoresist which would cause heat induced cross-linking, baking said first photoresist layer to improve the adhesion of said layer to said substrate while avoiding heat induced cross-linking of said layer, forming a second layer of photoresist on top of the first layer, imagewise exposing the second photoresist layer, and developing a relief image in the photoresist layers.

2. The process according to claim 1 wherein the first photoresist layer comprises a photoresist containing m-cresol formaldehyde novolak resin and a diazo ketone sensitizer.

3. The process of claim 1 wherein the second layer is a positive acting photoresist.

4. The process of claim 1 wherein the second layer is a negative acting photoresist.

5. The process of claim 2 wherein the photoresist layers are removed from the substrate following processing by treatment with a solvent at room temperature.

6. The process of claim 5 wherein said solvent is acetone.

7. The process of claim 1 wherein the baking step is carried out at a temperature of at least about 140°C.

8. The process according to claim 1, wherein said first and second layers of photoresist contain a m-cresol formaldehyde novolac resin and a diazo-ketone sensitizer said baking is at a temperature from about 140°C to about 170°C, and said relief image is developed by removing said layers in the areas where said second layer was exposed with an aqueous alkaline developer.

9. The process according to claim 4 wherein the developing of said relief image is by removal of the second layer in the unexposed areas with a solvent for the unexposed negative acting photoresist and then removing the underlying first layer with a solvent for the exposed positive resist.

* * * * *